United States Patent [19]
Ghosh et al.

[11] Patent Number: 5,771,098
[45] Date of Patent: Jun. 23, 1998

[54] LASER INTERFEROMETRIC LITHOGRAPHIC SYSTEM PROVIDING AUTOMATIC CHANGE OF FRINGE SPACING

[75] Inventors: Amalkumar P. Ghosh, Poughkeepsie; Susan K. Schwartz Jones; Gary W. Jones, both of Lagrangeville; Steven M. Zimmerman, Pleasant Valley; Yachin Liu, Poughkeepsie, all of N.Y.

[73] Assignee: Fed Corporation, Hopewell Junction, N.Y.

[21] Appl. No.: 721,460

[22] Filed: Sep. 27, 1996

Related U.S. Application Data

[60] Provisional application No. 60/004,580 Sep. 25, 1995.

[51] Int. Cl.$^6$ .................................................. G01B 9/02
[52] U.S. Cl. .................................... 356/363; 356/354
[58] Field of Search .................................. 356/345, 353, 356/354, 363

*Primary Examiner*—Frank G. Font
*Assistant Examiner*—Robert Kim
*Attorney, Agent, or Firm*—Collier, Shannon, Rill & Scott

[57] ABSTRACT

An interferometric lithographic apparatus includes an arrangement for applying interfering laser beams to a part for producing a first interference pattern. The first interference pattern has a first fringe spacing. A mobile part holder stage is repositioned to change the interference pattern and produce a second fringe spacing. A control arrangement, automatically responsive to the repositioning of the part holder, re-aligns optical paths and optimally interferes the laser beams to produce the second fringe spacing.

3 Claims, 3 Drawing Sheets

LASER INTERFEROMETRIC LITHOGRAPHIC SYSTEM PROVIDING AUTOMATIC CHANGE OF FRINGE SPACING

CROSS-REFERENCE TO RELATED APPLICATION

The priority of U.S. Provisional patent application No. 60/004,580 filed Sep. 29, 1995 is hereby claimed.

BACKGROUND OF THE INVENTION

1. Field of the Invention

This invention relates to laser interferometric lithography and more particularly an arrangement for changing fringe spacing.

2. Description of Related Art

In a two beam interferometric lithography system, an angle between the two interfering laser beams defines fringe spacing for a specific setup. Fringe spacing, in turn, defines between lines and the size of features that can be produced from the setup.

Fringe spacing in an interferometer is represented by a known equation:

$$2d \sin \theta = \lambda$$

where $\lambda$ is the wavelength of the light being used, $\theta$ is the half angle between the two interfering laser beams, and $\underline{d}$ is the fringe spacing (pitch is the center-to-center distance between adjacent fringes).

The width of the fringes, or fringe spacing, defines the ultimate size of the photoresist feature that is obtained. The technique of interference lithography works by exposing linear fringe patterns on a photoresist layer, coated onto the desired substrate. Two sets of linear fringes are used for forming either photoresist dots or holes. Typically, the substrate is exposed to two orthogonal linear fringe patterns. As a result, criss-cross patterns form. Upon development, either photoresist dots or holes are left depending upon the tone of the photoresist.

Most applications of interferometric lithography require varying the pitch and the feature size, to some extent, to accommodate the process involved. Varying the pitch and feature size requires changing the optical arrangement. Such a change of the optical arrangement is a very difficult, labor-intensive, time-consuming procedure and therefore is counter productive. In essence, a change of fringe spacing amounts to changing the angle subtended by the incident optical paths of the two laser beams, which interfere on the surface of the sample. This change requires precise, realignment of the entire optical setup.

SUMMARY OF THE INVENTION

These and other problems are resolved by a laser interferometric lithographic apparatus that receives a dial-in of a desired fringe spacing and automatically adjusts itself to that desired fringe spacing. No manual optical alignment changes are required after the dial-in information is given to the apparatus.

In one illustrative aspect, the apparatus and method are described for automatically changing fringe spacing provided by an apparatus including folding mirrors that can be automatically revolved and rotated into different positions. A laser diode is positioned in alignment with one of the laser beams. A position sensing light detector is mounted in alignment with the second laser beam. A mirror is affixed to the frame holding a sample part upon which an interference pattern is to be projected. The position sensing light detector produces signals that are applied to control signal circuitry for generating sets of rotating and tilting control signals having values relating to the level of illumination incident upon separate portions of the light detector. Control circuits, responsive to the sets of control signals, reposition the folding mirrors to reduce the difference between illumination levels incident upon the different portions of the light detector.

BRIEF DESCRIPTION OF THE DRAWINGS

The arrangement and advantages of the invention may be better understood by reading the following detailed description with reference to the drawings wherein.

DETAILED DESCRIPTION

Figure 1:
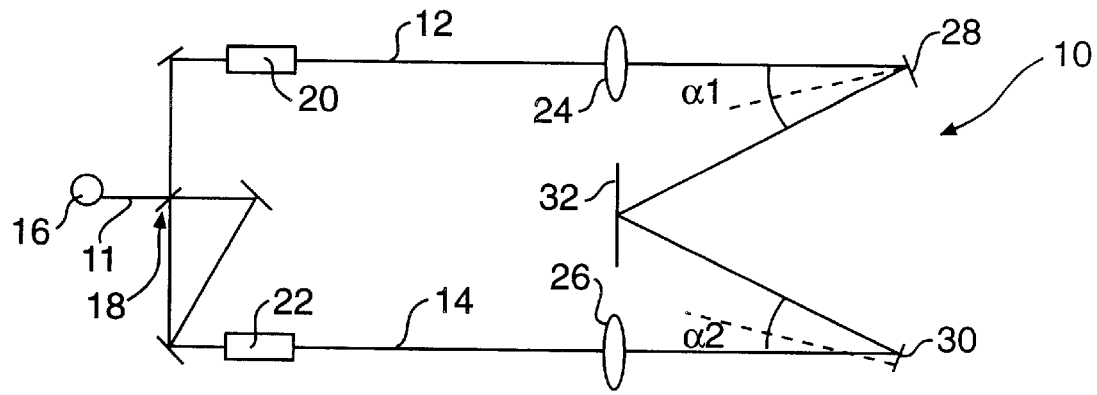
FIG. 1 is a schematic of a laser interferometric lithography apparatus having two laser light beams arranged in a folded configuration.

Referring now to FIG. 1, a laser interferometric lithography apparatus includes a laser 16 transmitting a light beam 11 to a beam splitter 18. The light beam 11 is split into components which deflect from mirrors through spatial filters 20,22. Emerging laser beams 12, 14 are directed, respectively, through collimating lenses 24, 26.

The spatial filters 20, 22 eliminate random and undesirable variations in the intensity profiles of the laser beams 12, 14. This greatly improves the quality of the laser beams for interference applications. Conceptually spatial filtering is quite simple. Each laser beam behaves like a distant point source of light. Spatial filtering involves focusing those beams to produce an image of the source with all imperfections in the optical path defocused in an annulus about the center axis. A pin hole in an otherwise opaque spatial filter permits transmission of a noise-free intensity profile for the outgoing laser beam. The noise in the annulus is blocked by the spatial filter.

The outgoing laser beams 12, 14 from the spatial filters 20, 22 are diverging beams. The collimating lenses 24, 26 bend the beams into parallel paths, i.e., collimated. Each collimating lens is positioned so that its focal point coincides with the position of the pinhole of the spatial filter in its laser beam path. In this arrangement, each collimating lens 24, 26 bends a diverging laser beam into a parallel, or collimated, beam.

By suitably folding the two collimated beams through reflection from plane mirrors 28, 30, the folded beams are redirected to interfere with each other on the surface of a target sample part which is to be patterned. The target part is affixed to a part holder 32. The use of the two plane mirrors, 28, 30 to reflect the beams in a direction opposite the original propagation direction is referred to as a folded configuration.

Advantageously, the part holder 32 is mounted upon a mobile stage which can be translated longitudinally along an axis that is aligned between the laser 16 and the part affixed to the target part holder 32. Movement of the stage can be controlled by a control signal. Such movements change fringe spacing in images incident to the surface of the target part.

Fringe spacing does not need to be detected at the part holder. The fringe spacing is accurately represented by the previously described equation. For any specific fringe spacing, the part holder 32 has to be linearly displaced from the folding mirrors 28, 30 by a predetermined distance that correlates with the half angle $\theta$. Data representing the correlation is stored in a data processor to be described. Such data is used by the apparatus to automatically adjust the linear displacement of the part holder 32 for the desired fringe spacing.

It is important for the computer controller to change the linear displacement automatically in small increments so that adjustments in other parts of the optical apparatus can be completed before further linear displacement occurs.

The plane mirrors 28, 30 of FIG. 1 are mounted on separate accurate fixtures (not shown) that provide automatic positioning control in two circular directions. The mirrors can be rotated about their vertical axis and they can be tilted about their horizontal axis. Such accurate fixtures are commercially available from the Newport Corporation. Rotation causes horizontal movement of reflected light and tilt provides vertical movement of the reflected light.

Figure 2:
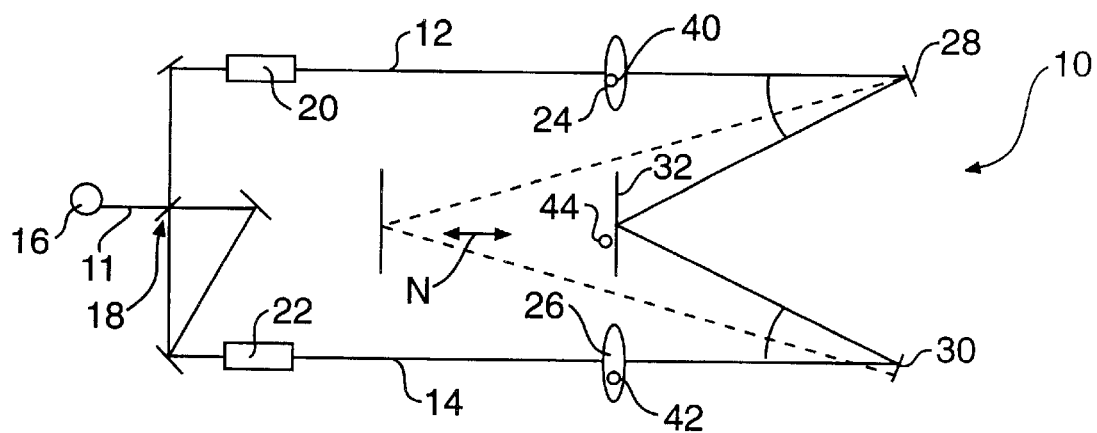
FIG. 2 is a schematic of a laser interferometric lithography apparatus having a part holder mounted on a longitudinally translatable stage.

Referring now to FIG. 2, there are shown additional elements used for adjusting fringe spacing. A small diode laser 40 with a built in collimating lens (available from vendors, such as Mitsubishi, Sony and Molles Griot, Inc,) is mounted, for example, on top of one of the collimating lens holder, such as, the holder of lens 24. The laser beam from the diode laser 40 is aligned exactly parallel to the collimated laser beam 12 and reflects from the folding mirror 28 to another plane mirror 44 that is mounted on the top portion of the part holder 32. The beam from the diode laser 40 reflects from the plane mirror 44 to the folding mirror 30 and from the mirror 30 to a quadrant type optical detector 42 that is mounted, for example, on the top of the lens holder of the collimating lens 26.

The diode laser 40 is used because it is small and easily mounted. It has a long wavelength of approximately 780 nm which will not expose photoresist on the target part. This diode laser is both inexpensive and long lived. Low laser light output is sufficient to control the positioning and repositioning of the part holder 32 and the plane mirrors 28, 30 to determine any desired fringe spacing on the target part.

Diode laser 40 is aligned exactly parallel to the optical axis of the collimating lens 24 by use of a standard alignment method, such as the auto-collimation method. Once aligned the diode laser 40 is permanently fixed in place on the lens holder. The same is true for the quadrangle detector 42 and the plane mirror 44.

When the fringe spacing is to be changed for the laser interferometric lithography apparatus, the diode laser 40 is activated together with control circuitry including the quadrant detector 42, a differential amplifier arrangement, a data processor, and the movement controllers for the part holder 32, the folding mirror 28 and the folding mirror 30. At this time the laser 16 may be turned off.

Figure 3:
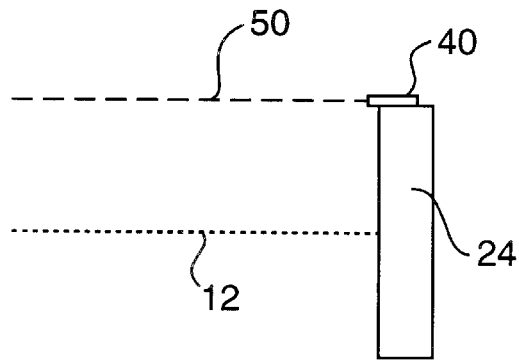
FIG. 3 shows a diode laser mounted on a collimating lens.

Referring now to FIG. 3, there is shown the diode laser 40 mounted on top of the holder of collimating lens 24. The laser beam 50 from the diode laser 40 is aligned exactly parallel to the main laser beam 12. This laser beam 50 is incident upon the folding mirror 28 or another small mirror mounted on the holder with its normal exactly matching the normal of the folding mirror.

The diode laser beam is reflected along the same path as the main laser beam 12 to the part holder and is incident upon the small mirror 44. The diode laser beam reflects from the small mirror 44 to the folding mirror 30, or another small mirror, and from it to the optical quadrant detector 42.

Figure 4:
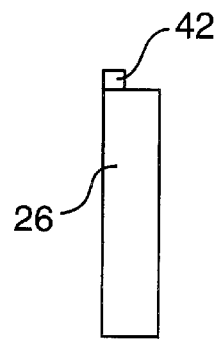
FIG. 4 shows a quadrant detector mounted on a collimating lens.

FIG. 4 shows the optical quadrant detector 42 mounted on top of the lens holder for the collimating lens 26.

Figure 5:
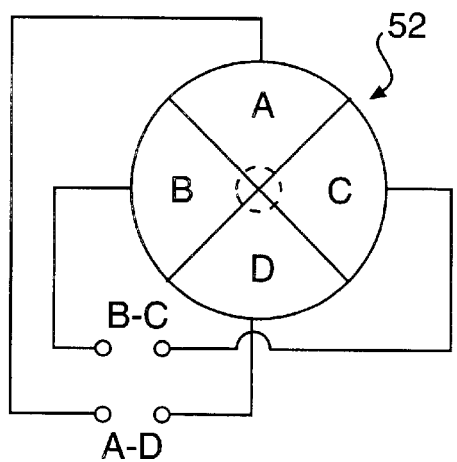
FIG. 5 shows a quadrant detector connected with a differential amplifier circuit for producing mirror repositioning control signals.

Referring now to FIG. 5, there is shown a frontal view of the incident light surface of a quadrant detector 52 that can be used in the interferometric lithography apparatus. Quadrants of the detector are shown and identified as A, B, C, and D. Output leads from the quadrants are paired up by opposite quadrants. Thus quadrant A is paired with quadrant D and B with C. The four quadrants of the detector 52 should be oriented in a top to bottom A-D and side to side B-C manner, as shown. Any difference voltage produced between the outputs A and D is used for adjusting the tilt movement of the folding mirrors 28, 30 about their horizontal axes. Any difference voltage produced between the outputs B and C is used for adjusting the rotational movement of the folding mirrors 28, 30 about their vertical axes.

Each of the quadrants of the detector 52 is isolated from all of the other quadrants. Therefore an incident light beam affects their outputs individually. An incident circular beam of light, as shown by the exemplary dotted circle, induces an output voltage on the output lead of each quadrant. The magnitude of the voltage produced by each quadrant depends upon the fraction of the light beam impinging upon that quadrant of the detector. When the incident light beam is centered among the quadrants, equal voltages are produced, for example, when the folding mirrors are accurately positioned for the longitudinal position of the part holder.

Any movement of the diode laser beam causes one or more of the quadrants to induce an increased voltage and a corresponding decrease of voltage in other quadrants.

Figure 6:
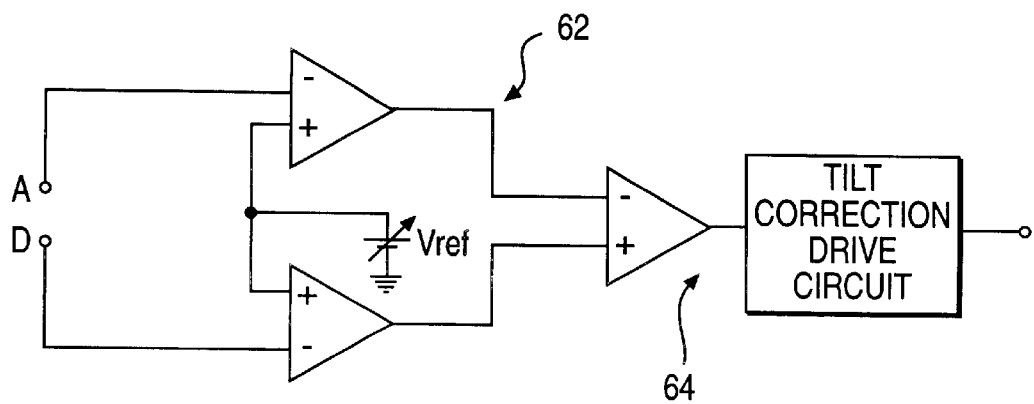
FIG. 6 shows an exemplary control signal circuit.

Referring now to FIG. 6, there is shown an exemplary differential amplifier circuit 62 that is arranged to receive, as inputs, the output signals from the quadrants A and D. The circuit 62 produces a tilt control signal 64 that is applied to a tilt correction drive circuit which is associated with one of the folding mirrors. This signal adjusts the tilt of the folding mirror. The other folding mirror is adjusted through a similar arrangement but with an opposite polarity of movement.

Figure 7:
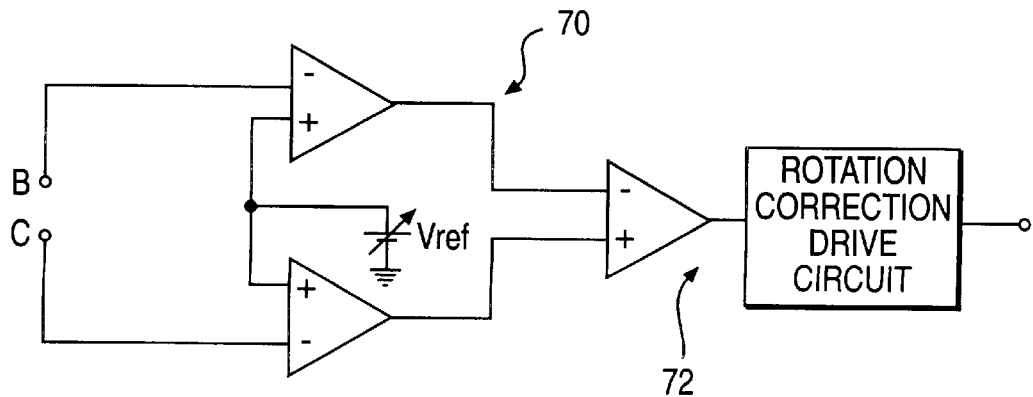
FIG. 7 shows another exemplary control signal circuit.

Referring now to FIG. 7, there is shown an exemplary differential amplifier circuit 70 that is arranged to receive, as inputs, the output signals from the quadrants B and C of the detector 52. Circuit 70 produces a rotational control signal 72 which is applied to a rotational correction drive circuit, associated with one of the folding mirrors. This rotational control signal 72 adjusts the side-to-side, or rotational, orientation of that folding mirror. The other folding mirror is controlled similarly but with an opposite polarity of movement.

The exemplary differential amplifier circuits and drive circuits work together to control repositioning of the folding mirrors for a new fringe spacing setup.

Figure 8:
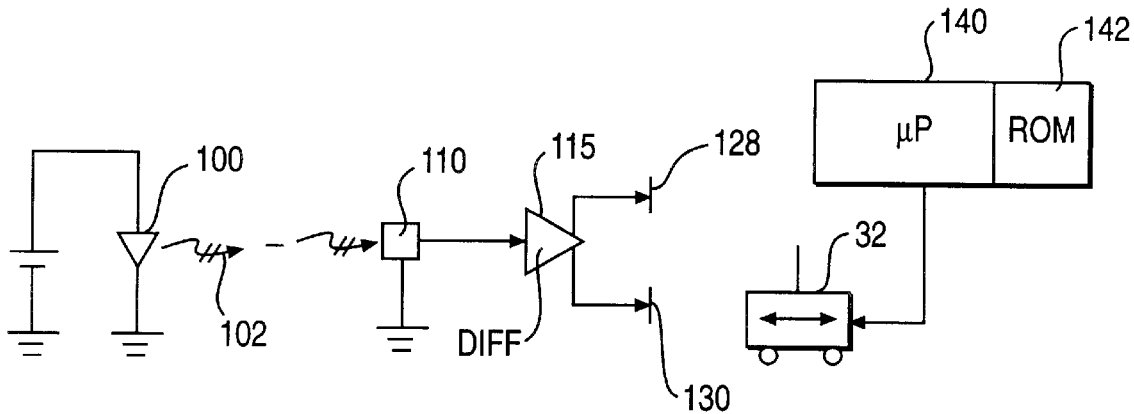
FIG. 8 shows an exemplary control apparatus arrangement.

Referring now to FIG. 8, there is shown a complete automatically adjustable interferometric lithographic apparatus. A laser diode 100 is energized to produce a light beam 102 which propagates along a path through two folding mirrors and a small mirror mounted on a part holder, the mirrors are not shown. The light beam is incident upon an optical quadrant detector 110 which produces differential output signals when the longitudinal position of the part changes. Differential amplifier 115 produces tilt and rotational control signals that control the positions of the folding mirrors 128 and 130. The folding mirrors positions are changed to reduce the difference signals caused by the diode laser light incident upon the quadrant detector 110.

A data processor 140, such as a microcontroller includes a storage media, such a read only memory (ROM) 142. Data stored in the ROM 142 includes data that correlates desired longitudinal locations of the part holder 32 of FIG. 1 for selected fringe spacings. A program residing in the data processor 140 accepts data representing a selected fringe spacing and accesses a look up table of the correlated part holder location in the ROM 142.

The accessed part holder location is incrementalized by the data processor. The determined increments are used to generate control signals that are applied to the mobile stage of the part holder 32 of FIG. 1 to move the part holder a short distance. The part holder remains until the mirror adjustments minimize the quadrant difference signals. Then the data processor generates another signal to move the mobile stage again. This procedure is iterated until the mobile stage positions the part holder for the selected fringe spacing and the folding mirrors are adjusted accordingly. Once the control arrangement completes the adjustments for the new fringe spacing, the diode laser 40 and the other control circuitry can be turned off while the main laser 16 is enabled to produce interfering beams for exposing photo-resist on a target part with the selected fringe spacing.

Referring once again to FIG. 1, angles a1 and a2 between the incident and reflected beams of the folding mirrors 28, 30 are maintained equal to each other. Such a condition assures automatic alignment of all beams in the interferometric lithography apparatus.

The foregoing describes an embodiment of the invention, which defined by appended claims. Those claims encompass the described embodiment together with other embodiments made obvious in view thereof.

What is claimed is:

1. An interferometric lithographic apparatus comprising:

first and second laser beams, the first beam directed along a first path and the second beam directed along a second path;

first and second folding mirrors, respectively, set in first and second adjustable positioning mechanisms, each mechanism adjusting the position of its folding mirror by rotating about a vertical axis and by tilting about a horizontal axis, the first folding mirror reflecting the first laser beam and the second folding mirror reflecting the second laser beam to intersect the reflected first laser beam;

a longitudinally translatable stage having a mirror affixed thereto and arranged for carrying a target device to be exposed to the first and second interfering reflected beams;

an optical quadrant detector positioned along the second path for determining different illumination levels incident thereto by quadrants and generating signals, each signal having a magnitude proportional to the illumination incident upon a different quadrant of the detector;

a diode laser positioned along the first path and transmitting in alignment with the first path to reflect from the first folding mirror to the mirror affixed to the stage, from the mirror affixed to the stage to the second folding mirror, and from the second folding mirror to the detector;

a control circuit arrangement, responsive to the four signals for producing first and second sets of rotating and tilting control signals;

the first positioning mechanism, responsive to the first set of rotating and tilting control signals, for repositioning the first folding mirror;

the second positioning mechanism, responsive to the second set of rotating and tilting control signals, for repositioning the second folding mirror; and the first and second folding mirrors being repositioned, in response to the first and second sets of rotating and tilting control signals, to reduce the difference between illumination levels incident upon the quadrants of the quadrant detector.

2. The apparatus of claim 1 further comprising:

a first spatial filter and collimating lens imposed in the first path of the first laser beam; and a second spatial filter and collimating lens imposed in the second path of the second laser beam.

3. The apparatus of claim 2 wherein the diode laser is affixed to a first lens holder of the first collimating lens, and the optical quadrant detector is affixed to a second lens holder of the second collimating lens.

* * * * *